(12) United States Patent
Kikuchi et al.

(10) Patent No.: US 7,417,861 B2
(45) Date of Patent: Aug. 26, 2008

(54) VEHICULAR POWER CONVERTER

(75) Inventors: Masao Kikuchi, Tokyo (JP); Isao Sonoda, Tokyo (JP); Yoshihito Asao, Tokyo (JP); Shigetoshi Ippoushi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 439 days.

(21) Appl. No.: 11/203,066

(22) Filed: Aug. 15, 2005

(65) Prior Publication Data

US 2006/0044762 A1 Mar. 2, 2006

(30) Foreign Application Priority Data

Aug. 31, 2004 (JP) ............................. 2004-252095

(51) Int. Cl.
*H05K 7/20* (2006.01)
(52) U.S. Cl. ...................................... 361/718; 361/792
(58) Field of Classification Search ................. 361/718, 361/794, 800, 797, 790, 769, 709, 687, 688, 361/696, 697, 701, 703, 792
See application file for complete search history.

(56) References Cited

U.S. PATENT DOCUMENTS 4,901,203 A * 2/1990 Kobayashi et al. .......... 361/737

6,501,662 B2 * 12/2002 Ikeda ......................... 361/760

FOREIGN PATENT DOCUMENTS

| JP | A 08-098557 | 4/1996 |
|---|---|---|
| JP | A 11-069774 | 3/1999 |

* cited by examiner

*Primary Examiner*—Hung S Bui
(74) *Attorney, Agent, or Firm*—Sughrue Mion, PLLC

(57) ABSTRACT

To provide a vehicular power converter with high reliability by effectively radiating heat generated in a power circuit section and control circuit section without using a cooling fan. The vehicular power converter includes a power circuit section provided with a switching element; a control circuit section for controlling the switching element; and a housing for accommodating the power circuit section and the control circuit section, wherein a first heat conducting layer intervenes between a base plate having a first heat exchange section for cooling the power circuit section and the power circuit section; a second heat conducting layer intervenes between a cover having a second heat exchange section for cooling the control circuit section and the control circuit section; and the first heat exchange section and the second heat exchange section are disposed on one main surface side and on the other main surface side of an outer circumferential surface part of the housing, respectively.

13 Claims, 7 Drawing Sheets

|  | Specification 1 | Specification 2 | Specification 3 |
|---|---|---|---|
| Presence or Absence of Through hole | Present | Present | Absent |
| Presence or Absence of Solder in Through hole | Absent | Present | Absent |
| Temperature Difference between both Surfaces of the Same Control Substrate | 14°C | 9°C | 24°C |

Fig. 8

VEHICULAR POWER CONVERTER

BACKGROUND OF THE INVENTION

1. Field of the Invention

The present invention relates to a vehicular power converter which is mounted in a vehicle or the like and, more particularly, to a heat radiation structure of a power converter having a power circuit section and a control circuit section.

2. Description of the Related Art

A power converter generally includes a power circuit section having a converter constituted by switching elements for converting a direct current to an alternating current of any frequency and a smoothing capacitor etc., and a control circuit section having a function for outputting a signal for controlling the switching elements and a function for electrical protection of the device. These sections are accommodated in a case. A power converter for regulating the input power of a three-phase motor incorporates two pairs of switching elements for each phase.

Since a power circuit section is used for regulating the input power to a motor, the electrical power rating is generally large and heat generation in the switching elements or the like is also large. Therefore, a converter is mounted on a base provided on one surface of a case, and cooling fins are provided on the surface outside the base to radiate the heat generation in the switching elements and to prevent an excessive temperature rise.

On the other hand, a control circuit section is formed by integrating a drive circuit and power supply circuit for driving the switching elements and a control circuit section including a microcomputer and a large capacity memory, which are formed on both surfaces of the substrate; and the control circuit section also has heat generation like the power circuit section.

As a known technology adopting countermeasures against heat generation of such a power circuit section and control circuit section, there is a power converter disclosed in Japanese Unexamined Patent Application Publication No. 11-69774, for example. In this technology, a power converter, a smoothing capacitor, and the like are mounted on a cooling fin base having cooling fins; a high-current substrate equipped with electronic components on the upper part thereof is provided; a control circuit substrate is further provided on the upper part; and a cover for covering all of these is provided, wherein the cover is provided with independent ventilating holes to draw cooling air for the control circuit, and the cooling fins and control circuit are simultaneously cooled with a predetermined amount of air by cooling fans provided outside the device.

In the above-mentioned known technology, some cost for mounting cooling fans on the case and consideration for the life-time of the fan are required and, more particularly, when this technology is applied to a power converter for use in a much more harsh environment, for example, in the case of a vehicular power converter, the reliability has been limited.

Further, there has been a problem in that provision of ventilating holes in the case cannot be applied for the above-mentioned vehicle-mounted application and apparatus for use in such an environment necessary for waterproof protection.

Furthermore, in the known technologies, a control circuit section is cooled by circulating ambient air inside the case; however, there has been a case in which, since the heat generated in the power circuit section of the power converter is generally larger than that in the control circuit section, the heat generated in the power circuit section is transmitted to the control circuit section instead of being transmitted to cooling fins, and consequently the temperature of the control circuit section is increased due to this heat. Therefore, there is a problem in that cooling means for cooling the control circuit section is required to provide a heat radiation performance that can handle a heat generation which is larger than the heat generation of the control circuit section, resulting in increased costs.

SUMMARY OF THE INVENTION

The present invention has been made to solve the problem described above, and an object of the present invention is to provide a vehicular power converter with high reliability by effectively radiating heat generated in a power circuit section and control circuit section without using a cooling fan.

A vehicular power converter according to the present invention includes: a power circuit section provided with a switching element; a control circuit section for controlling the switching element; and a housing for accommodating the power circuit section and the control circuit section, wherein a first heat conducting layer intervenes between a base plate having a first heat exchange section for cooling the power circuit section and the power circuit section; a second heat conducting layer intervenes between a cover having a second heat exchange section for cooling the control circuit section and the control circuit section; and the first heat exchange section and the second heat exchange section are disposed on one main surface side and on the other main surface side of an outer circumferential surface part of the housing, respectively.

The vehicular power converter according to the present invention, since it is configured as described above, each heat radiation path of the power circuit section and the control circuit section can be maintained; and since each heat exchange section of the power circuit section and the control circuit section are disposed in a space on one main surface part and the other main surface part of the outer circumferential part of the housing, the cooling air flow is divided, and therefore, heat-exchanged air flows at respective heat exchange sections do not interfere with each other. Consequently, a cooling structure with superior efficiency can be provided without providing a ventilating hole, a cooling fan, and the like; therefore, it is particularly effective for use in a vehicle-mounted power converter which is used in harsh environments.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a view showing a result of a temperature rise of the control substrate of the vehicular power converter according to Embodiment 4 of the present invention;

DETAILED DESCRIPTION OF THE INVENTION

Embodiment 1

Figure 1:
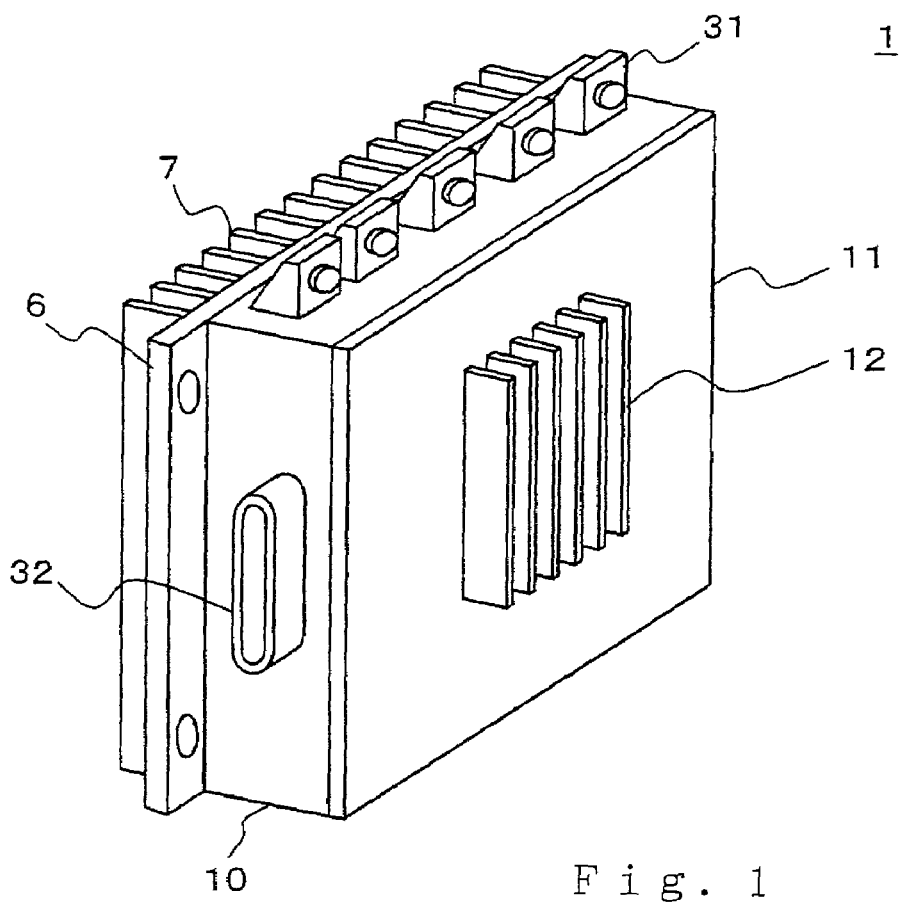
FIG. 1 is an outline view of a vehicular power converter according to Embodiment 1 of the present invention.
Figure 2:
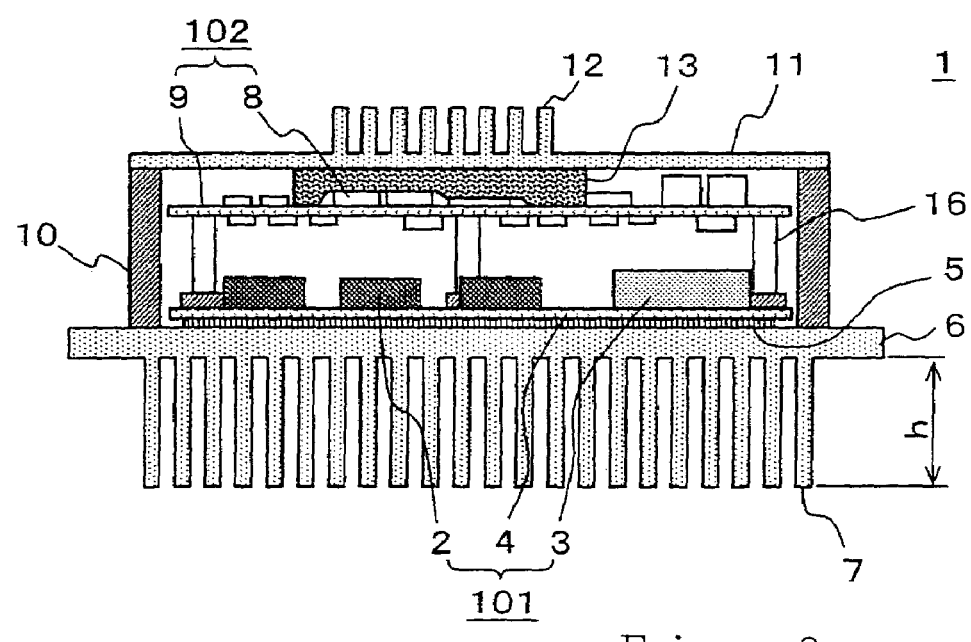
FIG. 2 is a sectional view of the vehicular power converter according to Embodiment 1 of the present invention.
Figure 3:
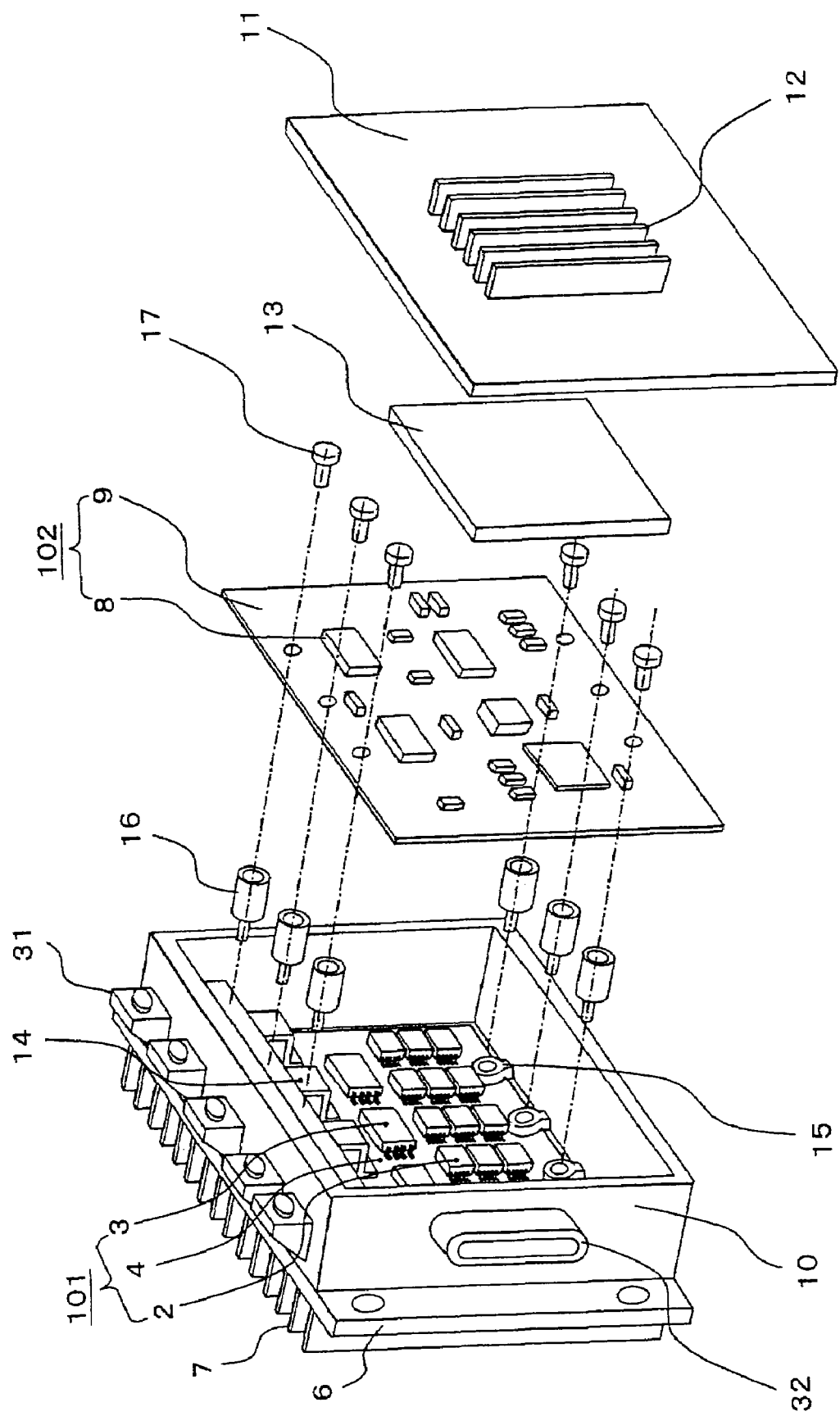
FIG. 3 is an exploded perspective view of the vehicular power converter according to Embodiment 1 of the present invention.

Hereinafter, a vehicular power converter according to Embodiment 1 will be described with reference to the accompanying drawings. FIG. 1 is a perspective view showing an outline view of a vehicular power converter according to Embodiment 1; FIG. 2 is a sectional view thereof; and FIG. 3 is an exploded perspective view.

First, the outline of a power converter 1, as shown in FIG. 1, includes a base plate 6 having a first heat exchange section 7, in which a power circuit section to be described later is mounted; a peripheral wall surface member 10 for placing a power circuit section and a control circuit section to be described later; and a cover 11 having a second heat exchange section 12. An external terminal 31, which is a conductive member for electrically coupling in and out of the power converter 1, and a signal connector 32 are mounted on the peripheral wall surface member 10.

Next, the internal configuration will be explained with reference to FIG. 2 and FIG. 3. First, as shown in FIG. 2, the power converter 1 includes a substrate 4 in which a switching element 2, a smoothing capacitor 3, and the like for converting an alternating current to a direct current are mounted; thus, a power circuit section 101 is constituted by these components. A first heat conducting layer 5, which is composed of a grease layer for performing transmission of heat generated in the power circuit section 101, is sandwiched between the power circuit section 101 and the base plate 6. Further, a first heat exchange section 7 made of radiating fins is formed on an outer circumference side of the base plate 6, whereby the power circuit section 101 exchanges heat with ambient air so as to be cooled through the substrate 4, the first heat conducting layer 5, the base plate 6, and the first heat exchange section 7.

On the other hand, a control circuit section 102 is mounted within the device on the side opposite to the first heat exchange section 7, as seen from the power circuit section 101. The control circuit section 102 includes electronic components 8 constituted by a driver circuit for driving the switching element 2, a protection circuit for protecting the power circuit section 101, a power supply circuit for supplying power to these circuits, and the like, which are assembled on both sides of the control substrate 9. Further, a control section for controlling a motor serving as a load may be included. These respective components are covered and protected by the peripheral wall surface member 10 mounted on the base plate 6 and the cover 11 mounted on an opening opposite to the base plate 6 of the peripheral wall surface member 10. A second heat exchange section 12 is mounted on a surface outside the cover 11. Further, a second heat conducting layer 13 is placed to intervene in a space between the control circuit section 102 and the cover 11. The second heat conducting layer 13 is constituted by, for example, a sheet made of silicon resin as a main component, a gelatinous material, or the like, whereby the control circuit section 102 exchanges heat with ambient air so as to be cooled through the control substrate 9, the electronic component 8, the second heat conducting layer 13, the cover 11, and the second heat exchange section 12.

The internal assembly configuration will be further explained in detail with reference to FIG. 3. The peripheral wall surface member 10 is mainly constituted by a resin, and a lead 14 for supplying a current to the power circuit section 101 is inserted in the peripheral wall surface member 10. Then, the external terminal 31, which corresponds to the lead 14, is provided on the outside and the signal connector 32 for exchanging signals is mounted on a side surface part, permitting in and out of the power converter 1 to be electrically connected by these conductive members. The control circuit section 102 is mounted on a plurality of protrusions 15 which are provided from the peripheral wall surface member 10 toward the inside of the device via supporting members 16 and is secured by screws 17. By such a configuration, solid heat transfer paths connecting the power circuit section 101 and the control circuit section 102 are only the protrusions 15 and the supporting members 16. The protrusions 15 are formed of the same material as the peripheral wall surface member 10, that is, resin. On the other hand, the supporting members 16 are formed of a metal, such as aluminum or iron, to support the control circuit section 102 securely. However, a material other than metal may be used so long as there is no problem in strength; a material with small thermal conductivity is desirable.

The operation of the thus-configured power converter 1 will be described. Electronic components for use in the power circuit section 101 and the control circuit section 102 cause heat generation due to their impedance when current is supplied, and temperature of component itself rises. More particularly, the switching element 2 of the power circuit section 101 has a large heat value because large power is applied, and a component such as a voltage regulator of the control circuit section 102 also has relatively a large heat value. Further, the control circuit section 102 has many components which are sensitive to heat. Therefore, if a sufficient cooling structure is not provided, heat damage may occur due to self-heat generation or heat received from peripheral components.

Consequently, heat flow generated in the power circuit section 101 is heat exchanged, through the first heat conducting layer 5, with ambient air from the base plate 6 through the first heat exchange section 7. On the other hand, the second heat conducting layer 13 is placed to intervene in a space between the control circuit section 102 and the cover 11; heat flow from the control circuit section 102 is transmitted to the cover 11 in a solid heat transfer path through the second heat conducting layer 13 to exchange heat with the outside of the cover by the second heat exchange section 12 provided on the side opposite to the cover 11. Thus, a temperature rise of the control circuit section 102 can be effectively reduced.

The first heat exchange section 7 of the base plate 6 and the second heat exchange section 12 of the cover 11 are disposed on one main surface side and on the other main surface side of an outer circumferential surface part of the housing, respectively. Consequently, since natural convection air flowing into the first heat exchange section 7 and the second heat exchange section 12 do not interfere with each other, the reciprocal inflow air temperatures do not rise because of no interference, and therefore the increased heat of the power circuit section 101 and the control circuit section 102 can be radiated at the respective heat exchange sections 7 and 12.

Further, in the case where the power converter 1 is mounted in a vehicle, if both surfaces of the base plate 6 and the cover 11 are disposed in a direction as shown in FIG. 1, that is, in a substantially vertical direction, and if fins of the first heat exchange section 7 and the second heat exchange section 12, which are constituted by radiating fins, are disposed in the vertical direction, heat generated inside the device can be effectively radiated by heat exchange with a rising air current of the ambient air performing natural convection.

Next, the relationship between thermal resistances of the heat transfer paths which extend from internal components to the first heat exchange section 7 and the second heat exchange section 12 will be described. A thermal resistance Rth1 which extends from the power circuit section 101 to ambient air through the first heat conducting layer 5, the base plate 6, and the first heat exchange section 7 is determined from the thermal conductivity of the materials constituting these members and the shapes such as their thicknesses, areas, and the like. Similarly, a thermal resistance Rth2 which extends from the control circuit section 102 to ambient air through the second heat conducting layer 13, the cover 11, and the second heat exchange section 12 is also determined from the thermal conductivity of the materials constituting these members and the shapes. Heat generation W1 of the power circuit section 101 is set larger than heat generation W2 of the control circuit section 102. Therefore, in the case that thermal insulation is provided except for the above thermal resistances, when temperature rises of the power circuit section 101 and the control circuit section 102 to with respect to the ambient air are set as ΔT1 and ΔT2 respectively, then $$\Delta T1 = W1 \times Rth1$$

$$\Delta T2 = W2 \times Rth2.$$

Here, in the case of ΔT1 >ΔT2, heat flow from the power circuit section 101 to the control circuit section 102 is generated thus raising the temperature of the control circuit section 102. Then, the temperature rises are set as ΔT1≦ΔT2 so that the control circuit section 102 is not thermally influenced by the power circuit section 101, and the relationship between the thermal resistance Rth1 between the power circuit section 101 and ambient air and the thermal resistance Rth2 between the control circuit section 102 and ambient air may be set as follows:

$$Rth1 \leq Rth2 \times W2/W1 \text{ (in this regard, } W1 > W2)$$

In doing so, the control circuit section 102 does not receive heat from the power circuit section 101, whose heat generation is large, and can thus restrict the temperature rise.

As described above, in order to set the thermal resistance Rth1 between the power circuit section 101 and ambient air smaller than the thermal resistance Rth2 between the control circuit section 102 and ambient air, it is effective that the surface area of the first heat exchange section 7 be set larger than that of the second heat exchange section 12. Consequently, in this embodiment, as shown in FIG. 2, the Rth1 is set to be small by increasing the height h of the heat radiation fins constituting the first heat exchange section 7 and the number of fins to increase the heat radiation area on the base side.

Next, the thermal resistance of heat transmitted from the power circuit section 101 to the control circuit section 102 will be described. The thermal resistance of the power circuit section 101 and the control circuit section 102 is the sum of the thermal resistance of the protrusions 15 and the supporting members 16. Therefore, in this embodiment, the protrusions 15 are integrally formed with the peripheral wall surface member 10 and are made of resin with a large thermal resistance. With this, the amount of heat input from the power circuit section 101 to the control circuit section 102 can be constrained. Material such as PPS (polyphenylene sulfide), PBT (polybutylene terephthalate), PET (polyethylene terephthalate), nylon, which have small thermal conductivity, which provide good structural strength as a peripheral wall surface member, and which provide excellent insulation, can be used as the resin material of the peripheral wall surface member 10 and the protrusions 15.

Further, the above-mention describes an example in which the supporting members 16 are secured by screws, but it is not limited to this provided that sufficient mechanical retention can be ensured. In addition, the above-mention describes an example in which the control circuit section 102 is mounted to the supporting member 16 attached to the protrusions 15; but, it may be configured such that the control circuit section 102 is directly mounted to the protrusions 15 without using the supporting members 16 or directly mounted to the peripheral wall surface member 10; for example, the peripheral wall surface member 10 may have steps so that the control circuit section is mounted on the steps.

Furthermore, the lead 14 may be mounted as a separate member from the peripheral wall surface member 10 other than inserting it into the peripheral wall surface member 10. The gist of this embodiment is to mount the control circuit section through the peripheral wall surface member made of resin, which has large thermal resistance. Therefore, the configuration of the peripheral wall surface member and the structure for mounting the control circuit section are not limited to this description.

As described above, according to the present invention of this embodiment, the first heat conducting layer intervenes between the base plate having the first heat exchange section for cooling the power circuit section and the power circuit section; the second heat conducting layer intervenes between the cover having the second heat exchange section for cooling the control circuit section and the control circuit section; and the first heat exchange section and the second heat exchange section are disposed on one main surface side and on the other main surface side of the outer circumferential surface part of the housing, respectively. Therefore, each heat radiation path of the power circuit section and the control circuit section can be maintained; and since each heat exchange section of the power circuit section and the control circuit section are disposed in a space on one main surface side and the other main surface side of the outer circumferential part of the housing, the cooling air flow is divided, and therefore, heat-exchanged air flows at respective heat exchange sections do not interfere with each other. Consequently, a waterproof structure, completely covering the internal electronic components with the peripheral wall surface member, the base plate, and the cover, can be easily obtained without providing a ventilating hole, a cooling fan, and the like, whereby it becomes very effective for use in a vehicle-mounted power converter which is used in harsh environments.

Further, the heat generation of the power circuit section is set to be larger than the heat generation of the control circuit section; and the thermal resistance which extends from the power circuit section to ambient air through the first heat exchange section is set to be smaller than the thermal resistance which extends from the control circuit section to the ambient air through the second heat exchange section. Therefore, temperature gradients of the power circuit section and the control circuit section are made small to prevent heat interference between the two circuits.

In addition, the heat radiation area of the first heat exchange section is set to be larger than the heat radiation area of the second heat exchange section, and therefore, the thermal resistance which extends from the power circuit section to the outside of the device through the first heat exchange section can be easily adjusted so as to be smaller than the thermal resistance which extends from the control circuit section to the outside of the device through the second heat exchange section.

Further, the housing includes the base plate having the first heat exchange section and the cover having the second heat exchange section; accommodates the power circuit section and the control circuit section disposed between the base plate and the cover; and includes a resin-made peripheral surface member for fixing and supporting outer circumference portions of the base plate and the cover, wherein the conductive member for electrically coupling in and out of the power converter is mounted on the peripheral surface member. Therefore, the first and second heat exchange sections are mounted through the housing with poor thermal conductivity, and consequently, reciprocal heat interference at the heat exchange sections can be considerably reduced.

Furthermore, the control circuit section is supported by the peripheral wall surface member of the housing or the supporting members provided on the peripheral surface member, and therefore, the thermal resistance of the solid heat transfer paths which extend from the power circuit section to the control circuit section is made large to be able to reduce the heat flow from the power circuit section to the control circuit section Embodiment 2

Figure 4:
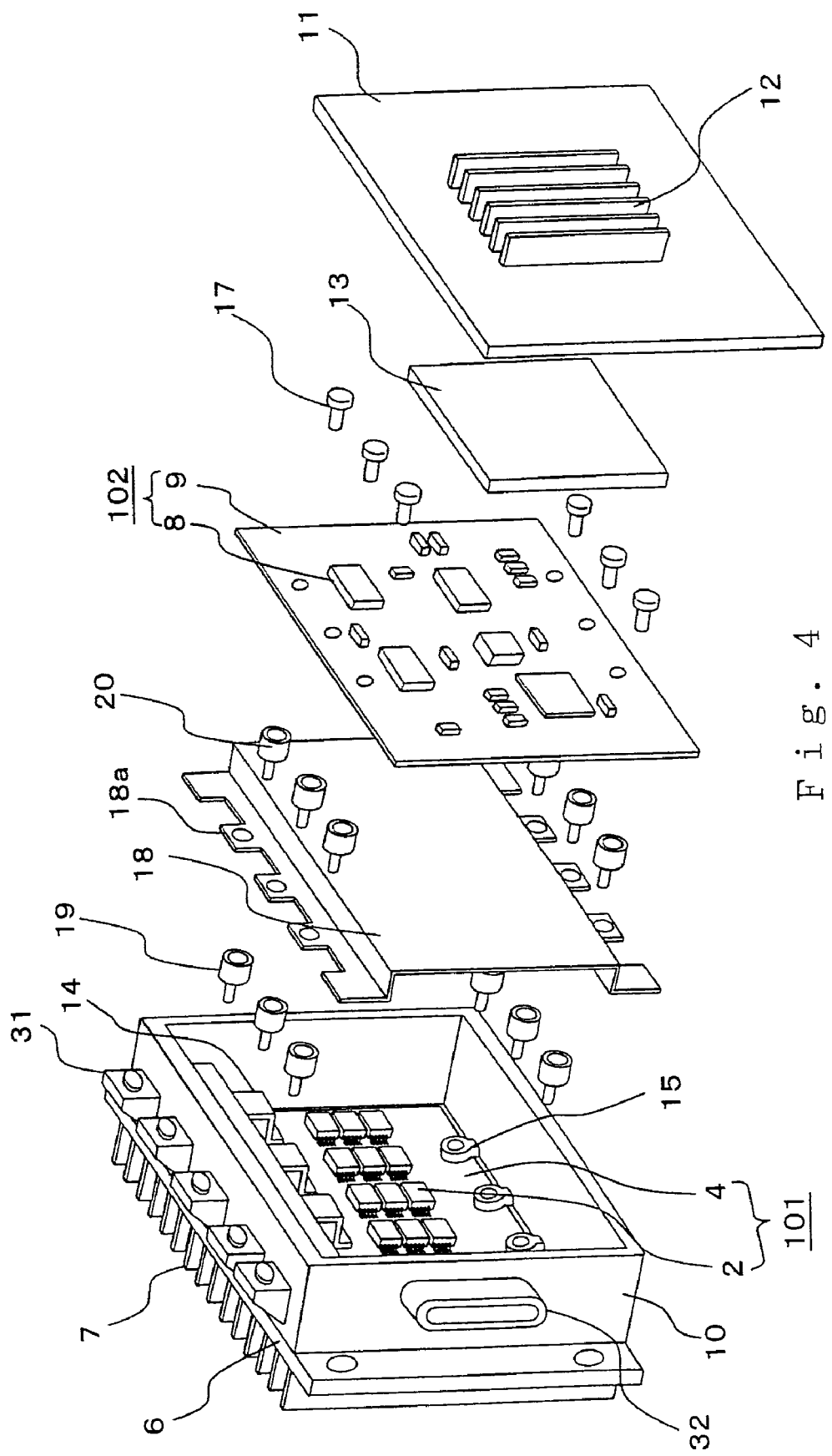
FIG. 4 is an exploded perspective view of a vehicular power converter according to Embodiment 2 of the present invention.
Figure 5:
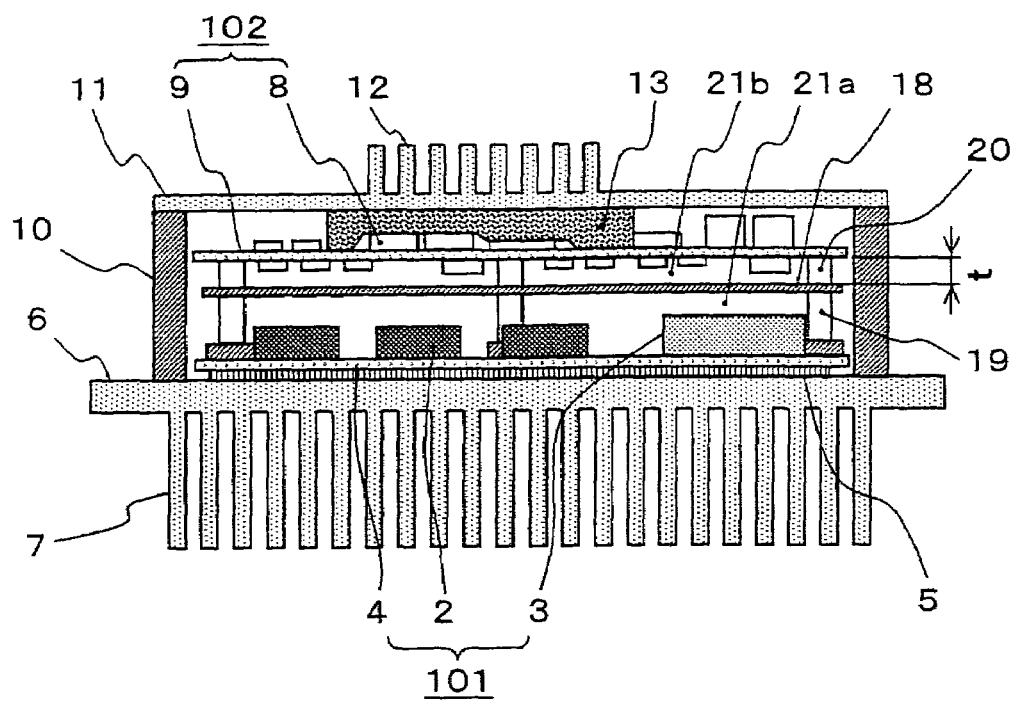
FIG. 5 is a sectional view of the vehicular power converter according to Embodiment 2 of the present invention.

FIG. 4 is an exploded perspective view of a vehicular power converter according to Embodiment 2 and FIG. 5 is a sectional view thereof. In the figures, those equivalent to FIG. 1 to FIG. 3 described in Embodiment 1 are shown by the same reference numbers and their description will not be repeated. One difference from Embodiment 1 is a heat shield member 18 which is provided between the power circuit section 101 and the control circuit section 102, and therefore, the heat shield member 18 will be mainly described.

As shown in the figures, mounting of the heat shield member 18 is carried out so that supporting members 19 are first mounted to protrusions 15 integrally formed on a peripheral wall surface member 10, then mounting pads 18a of the heat shield member 18 are aligned with the supporting members 19, and the heat shield member 18 is fixed with supporting members 20.

Next, mounting of the control circuit section 102 is carried out so that mounting holes of the control circuit section 102 are aligned with the supporting members 20 and the control circuit section 102 is fixed with screws 17. The supporting members 19 and 20, as in the case of the supporting members 16 in FIG. 3 of Embodiment 1, securely support the control circuit section 102 by using a metal material such as aluminum or iron.

With the above configuration, as shown in the sectional view of FIG. 5, air layers 21a and 21b are formed between the heat shield member 18 and both the power circuit section 101 and the control circuit section 102.

Next, the operation will be described. By providing the heat shield member 18, the thermal resistance between the air layers 21a and 21b and the heat shield member 18 increases compared to the case where no heat shield member 18 is provided, and therefore, the heat flow which extends from the power circuit section 101 to the control circuit section 102 decreases.

Since the thermal resistance between the air layers 21a and 21b and the heat shield member 18 is the sum of heat transfer due to natural convection and heat transfer due to heat radiation, the radiation thermal conductivity is required to be constrained in order to enhance the heat shielding effect between the power circuit section 101 and the control circuit section 102. This is achieved by forming the heat shield member 18 of metal with a small radiation rate (emissivity). Among metal materials, for example, aluminum has a small radiation rate and is lightweight, thereby enhancing the heat shielding effect without increasing the weight of the device, and therefore, aluminum is a suitable material for the heat shield member 18. Further, except for metal material, a member coated with a thin metal film on a resin member may be used.

In the case where the material of the heat shield member 18 is made of metal material, it can also provide a function of blocking noise generated by the switching element 2 of the power circuit section 101 so as not to transmit it to the control circuit section 102.

Further, if the thickness size t of the air layer 21b in FIG. 5 is made small, the height of a convection space becomes small. Stagnation thus occurs because a sufficient rising air current cannot be generated, and the heat exchanging performance between air contacting heat shield member 18 and the control circuit section 102 is lowered, thereby blocking heat transfer.

According to experiments carried out by the inventors, it was verified that a temperature rise of the control circuit section decreases as the thickness t of the air layer 21b between the heat shield member 18 and the control circuit section 102 decreases, and there was an effect on convection suppression if the thickness was 8 mm or less.

As described above, according to this embodiment, the heat shield member is provided between the power circuit section and the control circuit section, and air layers are formed between the heat shield member and the power circuit section and between the heat shield member and the control circuit section, and therefore, thermal resistance increases because the heat transfer path composed of air and a solid, whereby an additional shielding effect can be achieved in addition to the effects of Embodiment 1.

Further, at least the surface of the heat shield member is made of a metal having a small radiation rate, and therefore radiation heat transfer to the control circuit section from the power circuit section can be reduced.

Furthermore, the air layer between the heat shield member and the control circuit section has a thickness of not more than 8 mm, and therefore, heat transfer due to convection in the air layer can be constrained to reduce the heat transfer.

Embodiment 3

Figure 6:
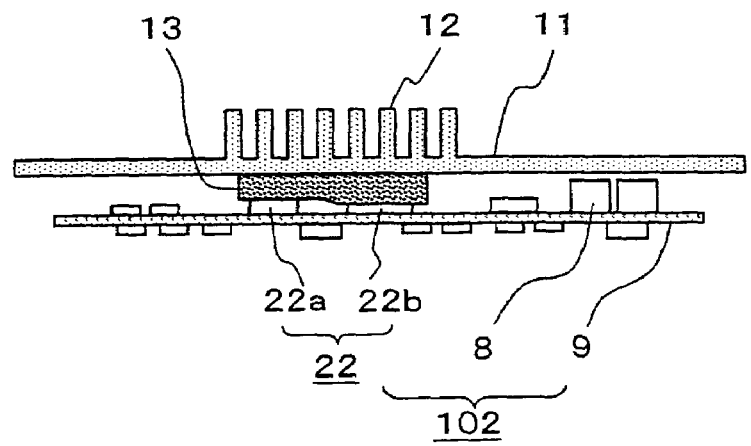
FIG. 6 is a partial sectional view of an essential part of a vehicular power converter according to Embodiment 3 of the present invention.

FIG. 6 is a partial sectional view of an essential part of a vehicular power converter according to Embodiment 3. The entire device is equivalent to FIG. 1 explained in Embodiment 1, and the entire sectional view except for that shown in FIG. 6 is equivalent to FIG. 2 of Embodiment 1 or FIG. 5 of Embodiment 2, and therefore, equivalent parts are shown by the same reference numbers and their description will not be repeated and only different parts will be mainly described.

As shown in the figure, electronic components 8 are mounted on both sides of a control substrate 9 which constitutes a control circuit section 102. The electronic components 8 generate heat when current is supplied, and an electronic component generating a particularly large amount of heat among the electronic components is denoted as heat generating components 22 to discriminate it. The heat generating components 22 are, for example, a voltage regulator 22a of a power supply circuit section, a driver 22b for driving a switching element, and the like. The feature of this embodiment is that a second heat conducting layer 13 intervenes in a space between the heat generating components 22 and a cover 11. That is, the second heat conducting layer 13 is provided by selectively fixing it to the upper surface of the heat generating components 22 among the electronic components 8. As a material of the second heat conducting layer 13, for example, a sheet mainly made of silicon resin, gelatinous material, or the like is used.

Dispersion arrangement of the heat generating components 22 disposed on a control substrate 9 is more effective in reducing the temperature rise because the heat generating components do not interfere with each other. Therefore, it also becomes effective to form a plurality of divided second heat conducting layers 13 for each of the heat generating components 22 of the dispersion arrangement.

As described above, according to the invention of this embodiment, the second heat conducting layer is selectively provided between the heat generating components having a large amount of heat generation among components constituting the control circuit section and the cover, and therefore, the material cost can be reduced by decreasing the quantity of material used in the heat conducting layer while the temperature rise is constrained by heat exchanging the heat generated by the heat generating components with ambient air.

Further, in this embodiment, an example in which the heat conducting layer is provided so as to be fixed on the upper surface of the electronic component is described; however, a configuration in which the heat conducting layer is fixed on the control substrate surface of the mounting part of the heat generating components mounted on the surface opposite to this example may have similar effects.

Embodiment 4

Figure 7:
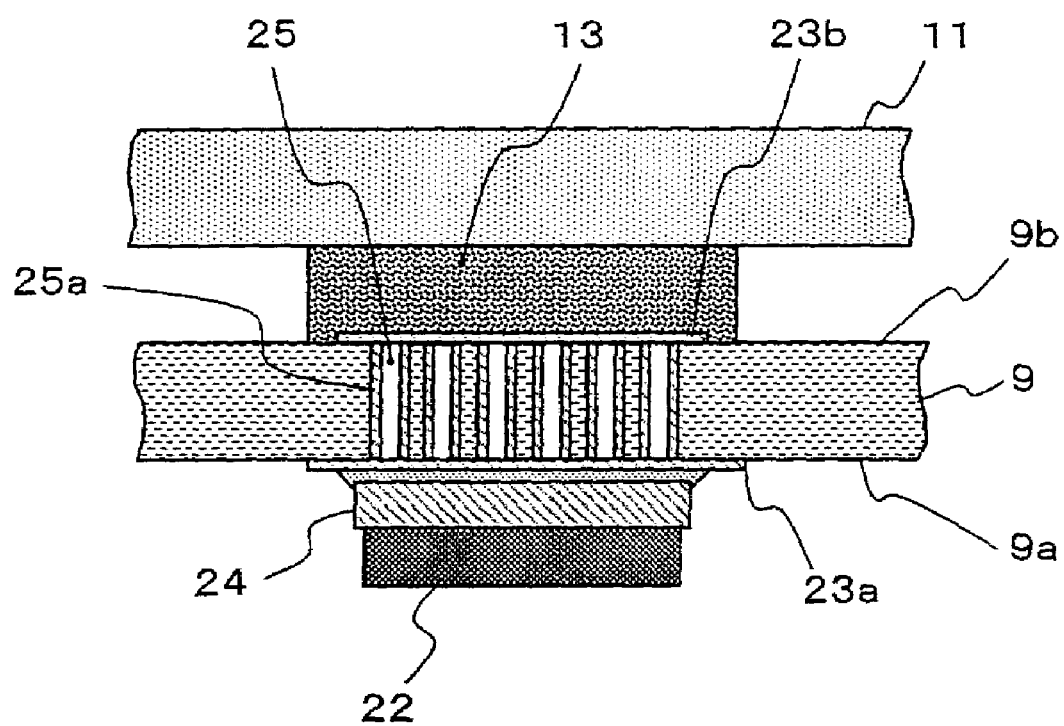
FIG. 7 is a partial sectional view of a control circuit section of a vehicular power converter according to Embodiment 4 of the present invention.

FIG. 7 is a partial sectional view of a control circuit section of a vehicular power converter according to Embodiment 4. The entire device is equivalent to FIG. 1 explained in Embodiment 1, and the entire sectional view except for that shown in FIG. 7 is equivalent to FIG. 2 of Embodiment 1 or FIG. 5 of Embodiment 2, and therefore, equivalent parts are shown by the same reference numbers and their description will not be repeated and only different parts will be mainly described.

Heat generating components 22 of this embodiment are mounted on a first main surface 9a of the control substrate 9, which is a surface on the side opposite to the cover 11; and a second heat conducting layer 13 is provided to be fixed to a second main surface 9b of the control substrate 9, which is the surface on the side of the cover 11, so as to bridge a space to the cover 11. The control substrate 9 is generally made of a material with a small thermal conductivity such as epoxy resin combined with glass fiber or phenol resin. Therefore, a copper pattern 23a is formed on the first main surface 9a on which the heat generating components 22 are mounted; and a metal plate 24, made of a copper group material or the like, included in the heat generating component 22 is fixed by soldering on the copper pattern 23a. The heat generating component 22 is mounted through a metal plate 24. Further, a copper pattern 23b is also formed on the second main surface 9b on which the second heat conducting layer 13 is fixed. Further, at the region where components are mounted beneath the heat generating component 22, through holes 25 are formed in the control substrate 9; and on the wall surfaces of the through holes 25, copper metal skins 25a are formed concurrently with the copper patterns 23a and 23b. That is, copper metal thin film layers with good thermal conductivity are formed from the region where the heat generating component 22 is mounted to the surface that comes in contact with the second heat conducting layer 13 of the second main surface 9b through inner circumferential surfaces of the through holes 25. The material of the metal thin film layer is not limited to copper; any material with good thermal conductivity may be used.

The heat radiation function of the control circuit section configured as described above will now be described. The heat transfer paths are formed from the heat generating component 22 to the second heat conducting layer 13 by the metal plate 24, the copper pattern 23a, the metal skins 25a, and the copper pattern 23b which have high thermal conductivity; therefore, the thermal resistance becomes considerably small compared to the case of the control substrate that has no through hole 25 and no copper patterns.

Further, as a method for reducing thermal resistance of the control substrate section, it was verified that it was effective to fill solder 26 in the through holes 25, as in the configuration of FIG. 7 was effective. FIG. 8 is a view showing a result of the temperature rise of the control substrate according to the presence or absence of the through holes and solder in the through holes. A test specimen had through holes 25 with an outer diameter of Φ0.5 mm, copper patterns 23a and 23b and metal skins with a thickness of 18 μm, and through holes 25 with a pitch of 1.8 mm, and these tested specimens were formed on the control substrate 9 (made of glass epoxy) beneath the heat generating component 22. A comparison of the temperature difference between both surfaces of the same control substrate in the case with and without solder 26 in the through holes 25 and in the case without the through holes 25 was conducted.

The result was such that, as shown in FIG. 8, compared to the case (specification 3) where no through holes are provided, the temperature rise can be decreased by 10° C. in the case of using the control substrate (specification 1) in which the through holes, the metal skins, and the metal thin film layers made of copper pattern are provided, as shown in FIG. 7; and the temperature rise can be decreased by 15° C. in the case (specification 2) where solder is further filled in the through holes.

As described above, compared to the case where through holes are provided, in the case where the through holes are filled with solder, the temperature difference between both surfaces can be decreased by approximately 40%, and therefore, it was confirmed that it had a substantial effect.

As a method of filling solder in the through holes, in the case where solder is filled in the through holes concurrently with surface mounting of the heat generating components, there is a possibility that molten solder spreads on the rear surface of the substrate through the through holes and drops, thus making it possible to obtain a thickness necessary for the solder layer under the heat generating component cannot be obtained. Thus, the following countermeasure was provided.

Figure 9:
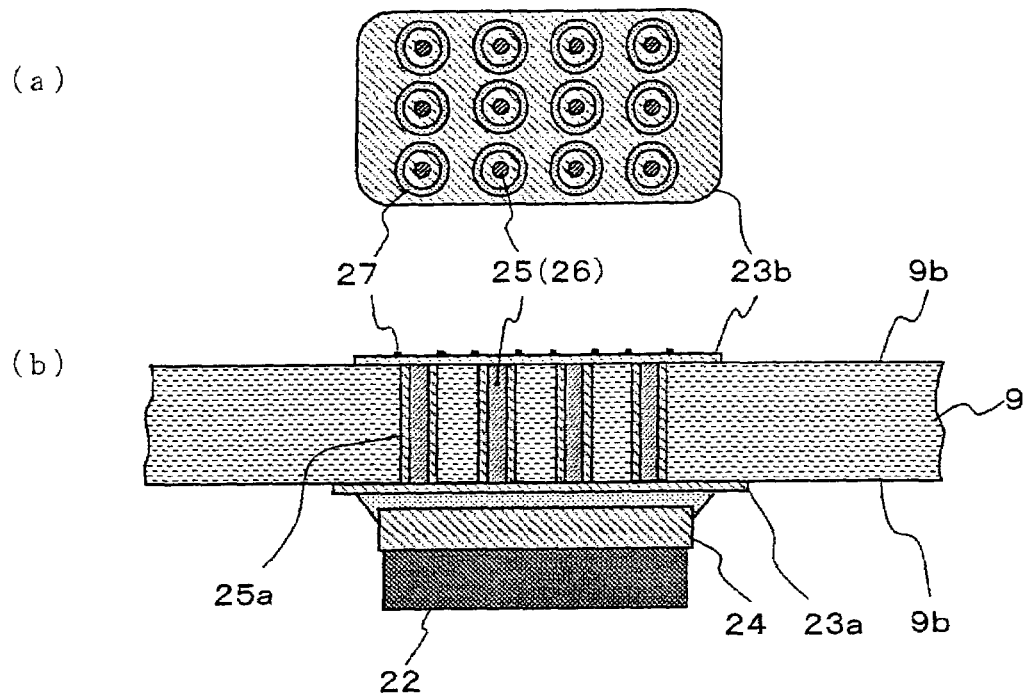
FIG. 9 is a partial sectional view showing another example of the control circuit section of the vehicular power converter according to Embodiment 4 of the present invention.

FIG. 9 is an enlarged sectional view of the control substrate in which prevention countermeasures against solder dripping are provided. As shown in the FIG, a resin layer 27 is formed along the outer circumference of through holes 25 on the side of a second main surface 9b of a control substrate 9. The resin layer 27 can be formed at the same time as manufacturing the substrate if a method such as solder resist or silk screen printing is used, so it is effective in practice.

Figure 10:
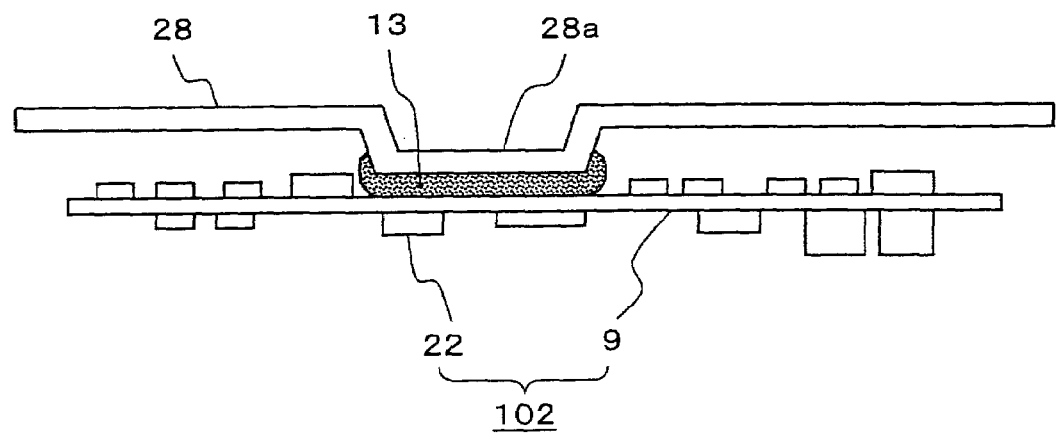
FIG. 10 is a partial sectional view showing other example of the control circuit section of the vehicular power converter according to Embodiment 4 of the present invention.

As described above, the thermal resistance can be considerably reduced by providing copper plated through holes, which serve as heat transfer paths, beneath the heat generating components of the control substrate. Therefore, if the configuration such as the specification 1 or specification 2 of FIG. 8 was actually adopted, it could be confirmed that the temperature rise could be suppressed to the predetermined level, even if fins were not provided on the heat exchange section on the cover side. FIG. 10 is a partial sectional view of the control circuit section and a cover section showing an example of a case where radiation fins are not provided on the cover. In this regard, the through holes and the copper pattern are not shown.

As shown in the figure, it is such that a cover 28 has a depressed area 28a formed toward the inside of the device at a fixing part to a second heat conducting layer 13 so as to reduce the thermal resistance by making the second heat conducting layer 13 thin. The depressed area 28a can be easily formed by sheet metal processing, and a heat exchange section can thus be made at extremely low cost.

Actually, in confirming the temperature rise of a heat generating component in the case that the power converter is operated when the cover 28 shown in FIG. 10 is formed of an aluminum sheet having a thickness of 1 mm by using the aforementioned through-hole pattern and is incorporated into the power converter, it was found that, in the case of specification 2 in which solder was filled in the through holes, the temperature difference between the ambient air temperature and the component could be constrained to approximately 20° C., and a desired heat-releasing effect could be ensured even in the case of the cover made by sheet metal processing.

As described above, according to the invention of Embodiment 4, the heat generating component is mounted on a first main surface which is a surface on the side opposite to the cover of the control substrate of the control circuit section; the second heat conducting layer is mounted between a second main surface which is a surface on the side of the cover of the control substrate and the cover; a plurality of through holes are formed within a region surrounded by an outer circumferential part of at least the heat generating component of the control substrate; and metal thin film layers with high thermal conductivity are mounted from a region in which the heat generating component of the first main surface is provided to a surface which comes in contact with the second heat conducting layer of the second main surface via inner circumferential surfaces of the through holes. Therefore, a heat spreader and heat conduction layer of the heat generating component can be made of solid metal for heat transfer to significantly improve the cooling performance of the heat generating component. Further, the thermal resistance can be effectively reduced by providing through holes in the control substrate beneath where electronic components are mounted.

In addition, since solder is filled in the through holes, the thermal resistance of the through hole parts can be further effectively reduced.

Further, since the resin formed on the outer circumferential parts of the through holes in the surface on which the metal thin film layer of the second main surface is provided, it is possible to prevent solder from leaking through to the second main surface when soldering the electronic components on the first main surface, whereby a predetermined solder layer thickness can be ensured.

In addition, since the cover is made of a sheet metal member to use as the second heat exchange section, weight saving and cost reduction of the cover can be realized.

Furthermore, since the depressed area is formed toward the control circuit section side at a part where the cover comes in contact with at least the second heat conducting layer to make the second heat conducting layer thin, the thermal resistance can be reduced by decreasing the heat conducting layer thickness while maintaining the allowable height of mountable electronic components.

While the presently preferred embodiments of the present invention have been shown and described. It is to be understood that these disclosures are for the purpose of illustration and that various changes and modifications may be made without departing from the scope of the invention as set forth in the appended claims.

What is claimed is:

1. A weatherproof vehicular power converter comprising:
a power circuit section provided with a switching element;
a control circuit section for controlling said switching element; and
a housing for accommodating said power circuit section and said control circuit section, said housing having a holeless cover, wherein:
a first heat conducting layer intervenes in a space between a base plate, having a first heat exchange section for cooling only said power circuit section, and said power circuit section;
a second heat conducting layer intervenes in a space between said cover, having a second heat exchange section for cooling only said control circuit section, and said control circuit section;
said first heat exchange section and said second heat exchange section are disposed on one main surface side and on an opposite main surface side of an outer circumferential surface part of said housing, respectively;
heat generation of said power circuit section is larger than heat generation of said control circuit section;
thermal resistance of a first path which extends from said power circuit section to ambient air through said first heat exchange section is smaller than thermal resistance of a second path which extends from said control circuit section to the ambient air through said second heat exchange section, said first and second paths being in a non-interfering arrangement;
a heat radiation area of said first heat exchange section is larger than a heat radiation area of said second heat exchange section; and
said first and second heat exchanger sections are physically spaced apart and electrically isolated from said power and control circuit sections.

2. The vehicular power converter according to claim 1, wherein
said housing includes said base plate having said first heat exchange section and said cover having said second heat exchange section; accommodates said power circuit section and said control circuit section disposed between said base plate and said cover; and further includes a resin-made peripheral wall surface member for fixing and supporting outer circumference portions of said base plate and said cover, and wherein
an electrically conductive member for electrically coupling in and out of said power converter is mounted on said peripheral wall surface member.

3. The vehicular power converter according to claim 2, wherein said control circuit section is supported by said peripheral wall surface member of said housing or a supporting member provided on said peripheral wall surface member.

4. The vehicular power converter according to claim 2, wherein a heat shield member is provided between said power circuit section and said control circuit section, and wherein air layers are formed between said heat shield member and said power circuit section and between said heat shield member and said control circuit section.

5. The vehicular power converter according to claim 1, wherein a heat shield member is provided between said power circuit section (101) and said control circuit section, and wherein air layers are formed between said heat shield member and said power circuit section and between said heat shield member and said control circuit section.

6. The vehicular power converter according to claim 5, wherein at least a surface of said heat shield member is made of a metal having a small radiation rate.

7. The vehicular power converter according to claim 5, wherein said air layer between said heat shield member and said control circuit section has a thickness of not more than 8 mm.

8. The vehicular power converter according to claim 1, wherein said second heat conducting layer is selectively provided between a heat generating component having a large heat generation among components constituting said control circuit section and said cover.

9. The vehicular power converter according to claim 8, wherein said heat generating component is mounted on a first main surface which is a surface on the side opposite to said cover of said control substrate of said control circuit section;

said second heat conducting layer is mounted between a second main surface which is a surface on the side of said cover of said control substrate and said cover;

a plurality of through holes are formed within a region surrounded by an outer circumferential part of at least said heat generating component of said control substrate; and metal thin film layers with high thermal conductivity are mounted from a region in which said heat generating component of said first main surface is provided to a surface which comes in contact with said second heat conducting layer of said second main surface via inner circumferential surfaces of said through holes.

10. The vehicular power converter according to claim 9, wherein solder is filled in said through holes.

11. The vehicular power converter according to claim 10, wherein a resin layer is formed on an outer circumferential part of said through holes in the surface on which said metal thin film layer of said second main surface is provided.

12. The vehicular power converter according to claim 9, wherein said cover is made of a sheet metal member to use as a second heat exchange section.

13. The vehicular power converter according to claim 12, wherein a depressed area is formed toward said control circuit section side at a part where said cover comes in contact with at least said second heat conducting layer to make said second heat conducting layer thin.

* * * * *